US009438194B2

(12) United States Patent
Krishnaswamy et al.

(10) Patent No.: US 9,438,194 B2
(45) Date of Patent: Sep. 6, 2016

(54) APPARATUS AND METHOD FOR DYNAMICALLY ADAPTING A USER VOLUME INPUT RANGE ON AN ELECTRONIC DEVICE

(71) Applicant: Apple Inc., Cupertino, CA (US)

(72) Inventors: Arvindh Krishnaswamy, San Jose, CA (US); Joseph M. Williams, Morgan Hill, CA (US)

(73) Assignee: Apple Inc., Cupertino, CA (US)

( * ) Notice: Subject to any disclaimer, the term of this patent is extended or adjusted under 35 U.S.C. 154(b) by 73 days.

(21) Appl. No.: 14/502,918

(22) Filed: Sep. 30, 2014

(65) Prior Publication Data

US 2015/0349738 A1    Dec. 3, 2015

Related U.S. Application Data

(60) Provisional application No. 62/004,755, filed on May 29, 2014.

(51) Int. Cl.
*H03G 3/20*   (2006.01)
*H03G 3/32*   (2006.01)

(52) U.S. Cl.
CPC ...................... *H03G 3/32* (2013.01)

(58) Field of Classification Search
None
See application file for complete search history.

(56) References Cited

U.S. PATENT DOCUMENTS

| 5,778,077 A * | 7/1998 | Davidson | H03G 3/32 340/4.37 |
| 6,049,268 A * | 4/2000 | Flick | B60K 28/00 340/12.54 |
| 6,205,217 B1 * | 3/2001 | Nobusawa | H03G 3/32 379/387.01 |
| 6,766,142 B2 | 7/2004 | King | |
| 7,392,066 B2 | 6/2008 | Haparnas | |
| 7,835,773 B2 | 11/2010 | Angelopoulos | |
| 2003/0179887 A1 * | 9/2003 | Cronin | H04M 19/044 381/57 |
| 2003/0179891 A1 * | 9/2003 | Rabinowitz | H04S 7/307 381/103 |
| 2004/0101145 A1 * | 5/2004 | Falcon | H04S 7/00 381/64 |
| 2012/0076311 A1 | 3/2012 | Isabelle et al. | |
| 2014/0010377 A1 * | 1/2014 | Hsu | H03G 7/00 381/57 |
| 2015/0063599 A1 * | 3/2015 | Ring | H04R 1/1083 381/107 |
| 2015/0349738 A1 * | 12/2015 | Krishnaswamy | H03G 3/20 381/107 |

FOREIGN PATENT DOCUMENTS

WO     2013134929 A1    9/2013

* cited by examiner

*Primary Examiner* — Peter Vincent Agustin
(74) *Attorney, Agent, or Firm* — Blakely, Sokoloff, Taylor & Zafman LLP

(57) ABSTRACT

Method of dynamically adapting user volume input range on mobile device having global volume range starts by receiving a volume input selection from a user that is level included in user volume input range. User volume input range is a portion of global volume range. Device's processor then detects ambient noise level surrounding device and adjusts user volume input range from current portion of global volume range to different portion of global volume range based on detected ambient noise level. Volume input selection remains at the same level included in user volume input range after user volume input range is adjusted. Processor may identify sound profile that corresponds to ambient noise level being detected and adjusts user volume input range to a different portion of the global volume range based on identified sound profile. Other embodiments are also described.

20 Claims, 4 Drawing Sheets

APPARATUS AND METHOD FOR DYNAMICALLY ADAPTING A USER VOLUME INPUT RANGE ON AN ELECTRONIC DEVICE

CROSS-REFERENCED APPLICATIONS

This application claims the benefit of the U.S. Provisional Application No. 62/004,755, filed May 29, 2014, the entire contents of which are incorporated herein by reference.

FIELD

An embodiment of the invention relate generally to an apparatus and a method for adapting a user volume input range on an electronic device that has a global input range without changing the user's volume input selection. Specifically, the user volume input range is a portion of the global input range that may be adapted based on the ambient noise level or sound (or noise) profiles.

BACKGROUND

Currently, a number of consumer electronic devices are adapted to output audio signals including speech and music via speaker ports, headsets, or external loudspeakers.

When using these electronic devices in the speakerphone mode or a headset, the environmental noise may greatly affect the desired volume that the user wishes to play the audio from the speakers or the headset. For instance, when the user goes from a quiet room (e.g., library) to a loud environment (e.g., a concert), the user may need to increase the device's volume level.

SUMMARY

Generally, the invention relates to an apparatus and method of dynamically adapting the volume input range that is presented to a user (i.e., the user volume input range) on an electronic device such that the volume input range adapted to include different portions of the entire volume range of the electronic device (i.e., the global volume range).

In one embodiment of the invention, a method of dynamically adapting a user volume input range on a mobile device having a global volume range starts with a user interface receiving a volume input selection that is a level included in the user volume input range. The user volume input range is a portion of the global volume range that is less than the entire global volume range. The processor that is included in the mobile device then detects a change in an ambient noise level surrounding the mobile device and adjusts the user volume input range to a different portion of the global volume range based on the ambient noise level being detected. In this embodiment, the volume input selection remains at the same level included in the user volume input range after the user volume input range is adjusted. In other embodiment, the processor identifies a sound profile that corresponds to the ambient noise level being detected and adjusts the user volume input range to a different portion of the global volume range based on the identified sound profile.

The above summary does not include an exhaustive list of all aspects of the present invention. It is contemplated that the invention includes all systems, apparatuses and methods that can be practiced from all suitable combinations of the various aspects summarized above, as well as those disclosed in the Detailed Description below and particularly pointed out in the claims filed with the application. Such combinations may have particular advantages not specifically recited in the above summary.

BRIEF DESCRIPTION OF THE DRAWINGS

The embodiments of the invention are illustrated by way of example and not by way of limitation in the figures of the accompanying drawings in which like references indicate similar elements. It should be noted that references to "an" or "one" embodiment of the invention in this disclosure are not necessarily to the same embodiment, and they mean at least one. In the drawings.

DETAILED DESCRIPTION

In the following description, numerous specific details are set forth. However, it is understood that embodiments of the invention may be practiced without these specific details. In other instances, well-known circuits, structures, and techniques have not been shown to avoid obscuring the understanding of this description.

Figure 1:
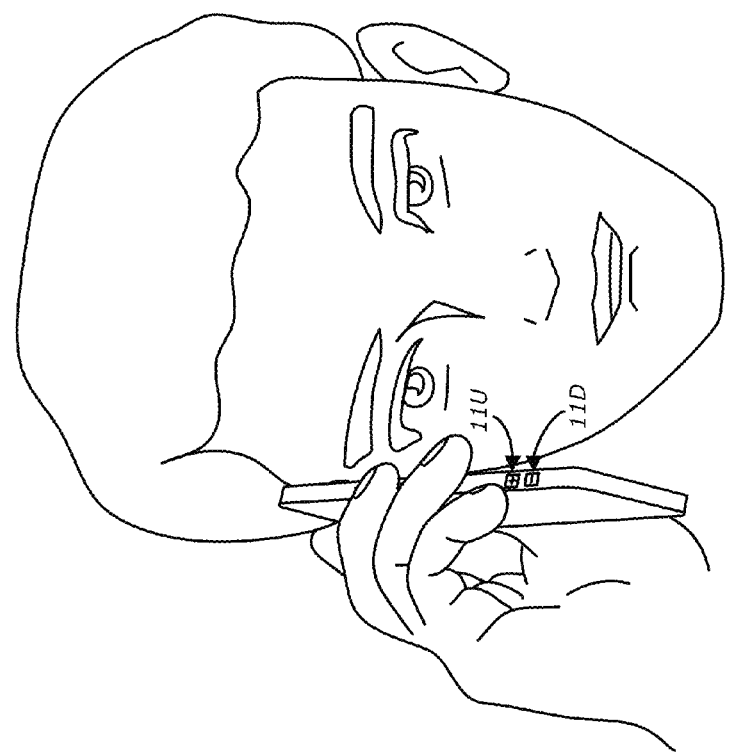
FIG. 1 illustrates an example of a consumer electronic device in which an embodiment of the invention may be implemented.

FIG. 1 illustrates an instance of a consumer electronic device (or mobile device) in which an embodiment of the invention may be implemented. As shown in FIG. 1, the electronic device 10 may be a mobile telephone communications device or a smartphone. The electronic device 10 may also be a tablet computer, a personal digital media player or a notebook computer.

Device 10 may include a housing that includes a display screen on the front face of the device 10. The display screen may also include a touch screen. Device 10 may also include one or more physical buttons and/or virtual buttons (on the touch screen). The one or more physical buttons and/or virtual buttons may be used to receive a volume selection input from the user. For example, the device 10 may include a button $11_U$ used to increase the volume from a current volume selection input (e.g., level 5/16) to a higher volume selection input (e.g., level 6/16) and may include a button $11_D$ used to decrease the volume from the current volume selection input (e.g., level 5/16) to a lower volume selection input (e.g., level 4/16). The display screen 16 may be used to display the current volume selection input on a user input scale (e.g., from 0/16 to 16/16) as it is being adjusted using the buttons $11_U$, $11_D$. In other embodiments, rather than being physical buttons, the buttons $11_U$, $11_D$ may also be virtual buttons that are displayed on the display screen and may be activated by the user via the touch screen.

Device 10 may also include input-output components such as ports and jacks. For example, the device 10 may include a first opening to form the microphone port and a second opening to form a speaker port. The sound during a telephone call is emitted through a third opening which forms a speaker port for a telephone receiver that is placed adjacent to the user's ear during a call. Further, when the device is used in speakerphone mode, for example, the openings may be used as speaker ports to output the audio signals.

Figure 2:
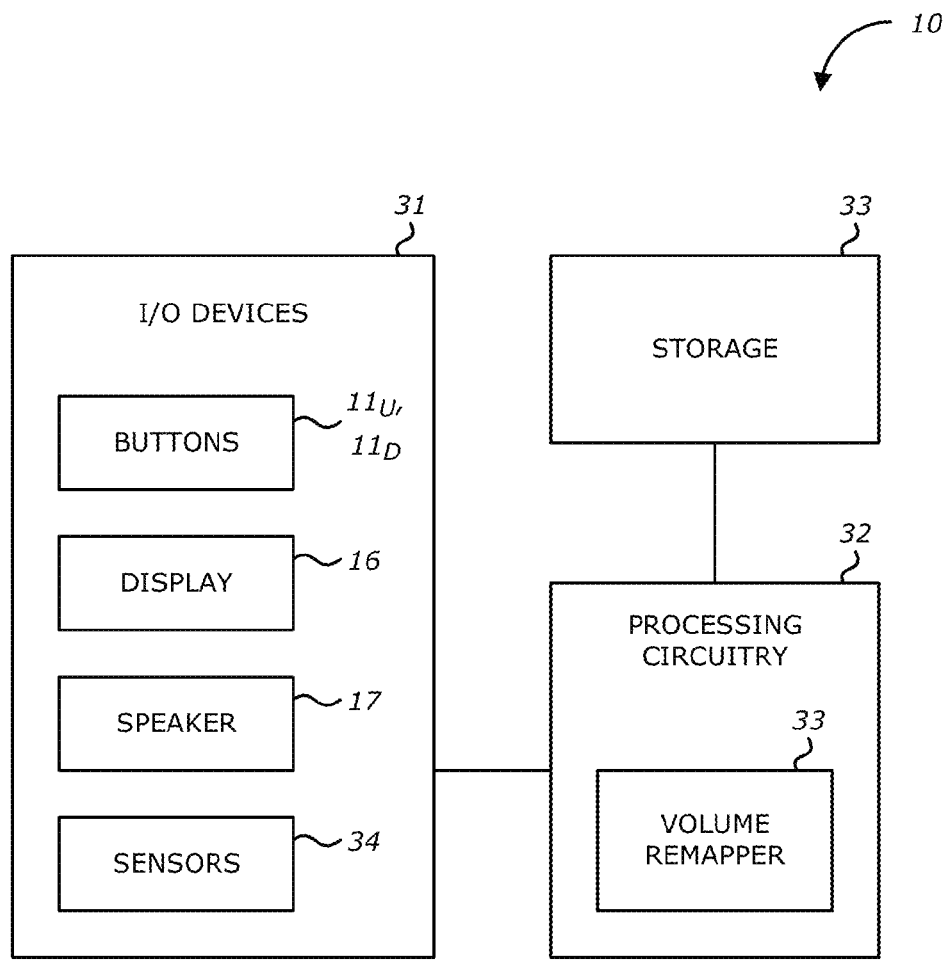
FIG. 2 illustrates a block diagram of an electronic device to dynamically adapt a user volume input range according to one embodiment of the invention.

FIG. 2 illustrates a block diagram of an electronic device to dynamically adapt a user volume input range according to one embodiment of the invention. As shown in FIG. 2, the electronic device 10 includes an input-output devices 31, processing circuitry 32, and storage 33.

Input-output devices 31 allow the device 10 to receive data as well as provide data. In one embodiment, input-output devices 31 may include the display screen 16, audio devices such as a speaker 17, and sensors 34, and user input-output devices. Using the user input-output devices, the user may supply commands to control the operations of the device 10. In one embodiment, the user input-output devices 40 include the display screen 16, the buttons, a microphone port, a speakerphone or loudspeaker port, and an earpiece speaker port (used as a close to the ear receiver port). As discussed above, the user may use a button $11_U$ to increase the volume from a current volume selection input to a higher volume selection input and may use a button $11_D$ to decrease the volume from the current volume selection input to a lower volume selection input.

Input-output devices 31 may include display 16 and audio devices such as speaker 17 that may contain audio-video interface equipment such as jacks and other connectors for external devices. The speaker 17 may be used to output audio signals at the current volume selection input. The input-output devices 31 may also include sensors 34 that are adapted to detect the ambient noise level surrounding the device 10.

While not shown, input-output devices 31 may also include wireless communications devices having communications circuitry such as radio frequency (RF) transceiver circuitry, antennas, etc. . . In one embodiment, the microphone port, the speaker ports may be coupled to the communications circuitry to enable the user to participate in wireless telephone or video calls. A variety of different wireless communications networks and protocols may be supported in the wireless communications devices 44. These include: a cellular mobile phone network (e.g. a Global System for Mobile communications, GSM, network), including current 2G, 3G and 4G networks and their associated call and data protocols; and an IEEE 802.11 data network (WiFi or Wireless Local Area Network, WLAN) which may also support wireless voice over internet protocol (VOIP) calling.

The processing circuitry 32 included in device 10 may include a processor, such as a microprocessor, a microcontroller, a digital signal processor, or a central processing unit, and other needed integrated circuits such as glue logic. The term "processor" may refer to a device having two or more processing units or elements, e.g. a CPU with multiple processing cores. The processing circuitry 32 may be used to control the operations of device 10 by executing software instructions or code stored in the storage 33. The storage 33 may include one or more different types of storage such as hard disk drive storage, nonvolatile memory, and volatile memory such as dynamic random access memory. In some cases, a particular function as described below may be implemented as two or more pieces of software in the storage 33 that are being executed by different hardware units of a processor.

The processing circuitry 32 (or simply processor) may include a volume remapper 35 to dynamically adapt a user volume input range as described below. In other embodiments, the processor 32 may be programmed by the volume remapper 35 (in the storage 33) to dynamically adapt a user volume input range as described below. The processor 32 may also execute software stored in the storage 33 that uses the wireless communications functionality of the device 10 to initiate an outgoing call and/or send a Short Message Services, SMS, text message, and to establish a TCP/IP connection (over a wireless link) with a remote server over the Internet.

In one embodiment, the processing circuitry 32 may receive the user volume input selection from the buttons $11_U$, $11_D$ and an ambient noise level from the sensors 34 and perform an analysis of that ambient noise level, as described below. For example, the ambient noise level may be analyzed through an artificial intelligence process or in the other ways described herein. As a result of that analysis, the processing circuitry 32 may then dynamically adapt a user volume input range as described below.

In one embodiment of the invention, the electronic device 10 may include a global volume range that is established during the tuning phase of the manufacturing of the electronic device 10. The global volume range may be tuned to include the lowest volume level (e.g., 0 or sound off) to the loudest volume level that the speaker 17 of the device 10 can output without distorting the audio to an undesirable level. To obtain the loudest volume level for the global volume range, the tuners may also tune a software stored in the storage 33 to cause the speaker 17 to output the loudest volume without distorting the audio to an undesirable level.

Figure 3:
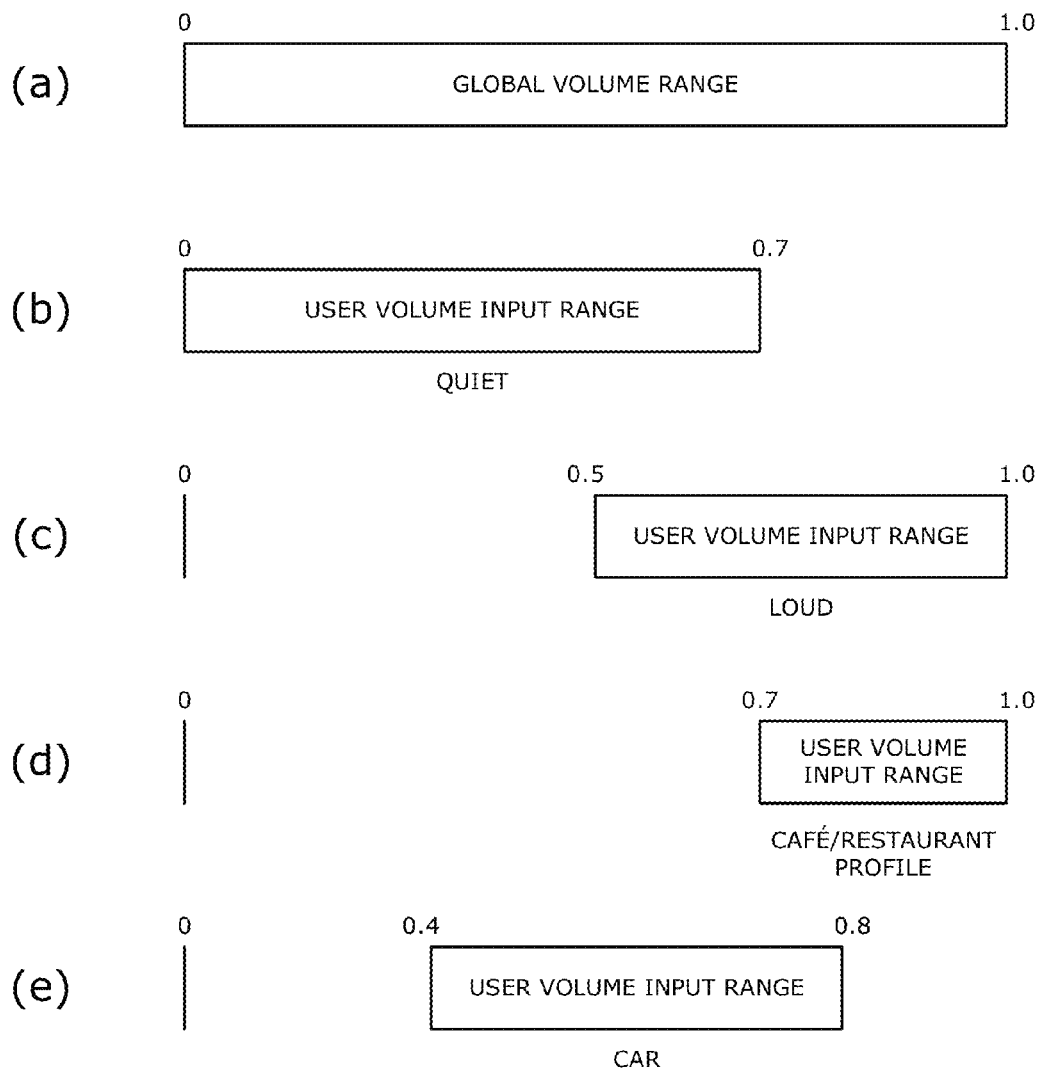
FIG. 3 illustrates examples of (a) a global volume range of the electronic device, (b) a user volume range when the ambient noise level is quiet, (c) a user volume range when the ambient noise level is loud, (d) a user volume range based on a restaurant sound profile, and (e) a user volume range based on a car sound profile, according to one embodiment of the invention.

The global volume range of the electronic device 10 is illustrated in FIG. 3(a) as including levels 0 to 1.0. A range that is accessible to the user may not include the entire range of the global volume range of the device 10. Instead, a portion of the global volume range is made available to the user, which is called the user volume input range. As shown in FIGS. 3(b)-(e), the user volume input range may be adjusted to include different portions of the global volume range in accordance to one embodiment of the invention. For instance, in one embodiment, a user inputs via a user interface (e.g., the buttons $11_U$, $11_D$) a desired level of volume that the speaker 17 is to output the audio signals from the electronic device 10. The desired level of volume that is input by the user may be referred to as the volume input selection. The volume input selection is a level of volume that is within the user volume input range. In some embodiments, the user volume input range may be displayed for the user on the display 16 as a meter having a plurality of levels (e.g., 16 levels). Thus, the volume input selection is a level (e.g., level 16/16). Further, if the user volume input range is set as the FIG. 3(b) user volume input range, the user volume input range is thus set to include the lower portion of the global volume range (e.g., 0-0.7). Accordingly, a volume input selection of 16/16 being the highest level in the user's volume input range may only correspond to a 0.7 on the global volume range of the device 10. However, if the user volume input range is set as the FIG. 3(c) user volume input range, the user volume input range is thus set to include the higher portion of the global volume range (e.g., 0 and 0.5-1.0), the volume input selection of 16/16 may correspond to a 1.0 on the global volume range of the device 10. Accordingly, while the volume input selection of 16/16 remains the same the underlying meaning of the volume input selection may change based on the portion of the global volume range that has been allocated or set for the user volume input range. Further, the user volume input range that has been remapped to the different portion of the global volume range may be applied to multiple Digital Signal Processing (DSP) blocks. In other words, the volume remapper 35 is block independent and may be fed in blocks such as the Dynamic Range Compression (DRC).

As shown in FIGS. 3(b)-(e), it is noted that each of the user volume input ranges also includes the 0 (e.g., sound off) of the global volume range of the device 10 which corresponds to a volume input selection of 0/16. Accordingly, for FIGS. 3(c)-(e), a volume input selection of 1/16 corresponds to a 0.5 on the global volume range of the device 10 in FIG. 3(c), corresponds to a 0.7 on the global volume range of the device 10 in FIG. 3(d), and corresponds to a 0.4 on the global volume range of the device 10 in FIG. 3(e).

In one embodiment of the invention, the volume remapper 35 receives the ambient sounds level from the sensors 34 as well as the user's volume input selection from the buttons $11_U$, $11_D$. The volume remapper may analyze the ambient sound levels to determine whether the device 10 is in an environment that is loud or quiet as well as the degree of loudness or quietness of the environment. If the volume remapper 35 determines that the ambient sound level has changed from a loud environment to a quiet environment, the volume remapper 35 may adjust the user volume input range to the lower portion of the global volume range (FIG. 3(b)) which may be associated with "quiet environments." The volume remapper 35 may determine that the ambient sound level indicates that the device 10 is in a quiet environment when the ambient sound level is lower than a pre-determined quiet threshold. Similarly, the volume remapper 35 may determine that the ambient sound level indicates that the device 10 is in a loud environment when the ambient sound level is greater than a pre-determined loud threshold. When the volume remapper 35 determines that the device 10 is in a loud environment, the volume remapper 35 may adjust the user volume input range to the higher portion of the global volume range (FIG. 3(c)) which may be associated with "loud environments." In one embodiment, when a device 10 that is in a quiet environment such that the user volume input range is allocated the lower portion of the global volume range (FIG. 3(b)) and the device 10 moves to a loud environment such that the user volume input range is adjusted to higher portion of the global volume range (FIG. 3(c)), the previously set volume input selection by the user (e.g., level 16/16) when the device was in the quiet environment remains unchanged when the device is now determined to be in the loud environment. Accordingly, if viewed on the display 16, the volume input selection still remains unchanged. However, since the underlying correspondences between the global volume range and the user volume input range have been adjusted, the volume at which the speaker 17 outputs the audio signals will be different (e.g., louder). Thus, the user volume input range is being dynamically changed based on the ambient sound level. In another embodiment, the volume remapper 35 may identify a sound profile (e.g., restaurant profile, car profile, street profile, etc.) that corresponds to the ambient noise level being detected and may adjust the user volume input range to a different portion of the global volume range based on the identified sound profile. For instance, FIG. 3(d) illustrates a user volume range based on a restaurant sound profile, and FIG. 3(e) illustrates a user volume range based on a car sound profile, according to one embodiment of the invention.

While illustrated as two discrete portions of the global volume range in FIG. 3(b) and FIG. 3(c), the user volume input range may be dynamically and gradually adjusted such that it is a smoothly moving window (or range) that is moving across the global volume range. However, the start (e.g., 0 on a global volume range) and the end (e.g., 0.7 on a global volume range) of user volume input range may also be varied (or tunable). In some embodiments, the start and the end of the user volume input range may be dynamically adjusted based on the ambient sound level or based on the sound profiles. Further, user volume input range may be adjusted to a plurality of different portions of the global volume range based on the ambient sound levels.

Moreover, the following embodiments of the invention may be described as a process, which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a procedure, etc.

Figure 4:
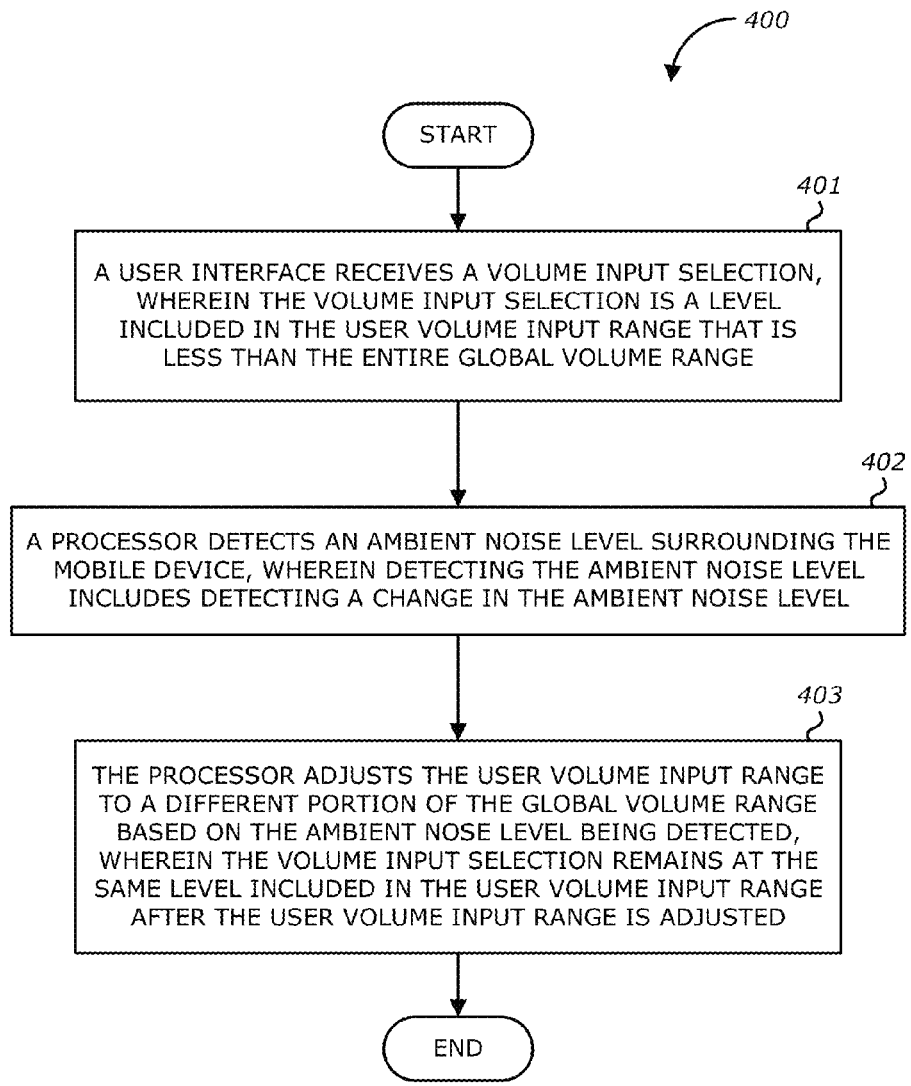
FIG. 4 illustrates a flow diagram of an example method to dynamically adapt a user volume input range on an electronic device to an embodiment of the invention.

FIG. 4 illustrates a flow diagram of an example method of dynamically adapting a user volume input range on a mobile device having a global volume range starts at Block 401 with the user interface receiving a volume input selection that is a level included in the user volume input range. The user volume input range may be a portion of the global volume range that is less than the entire global volume range. At Block 402, the processor include in the mobile device detects an ambient noise level surrounding the mobile device. Detecting the ambient noise level may also include detecting a change in ambient noise level. At Block 403, the processor adjusts the user volume input range to from a current portion of the global volume range to a different portion of the global volume range based on the ambient noise level being detected. In some embodiments, the volume input selection remains at the same level included in the user volume input range after the user volume input range is adjusted. In other embodiments, the processor may identify a sound profile (e.g., restaurant profile, car profile, street profile, etc.) that corresponds to the ambient noise level being detected and may adjust the user volume input range from a current portion of the global volume range to a different portion of the global volume range based on the identified sound profile.

In the description, certain terminology is used to describe features of the invention. For example, in certain situations, the terms "component," "unit," "module," and "logic" are representative of hardware and/or software configured to perform one or more functions. For instance, examples of "hardware" include, but are not limited or restricted to an integrated circuit such as a processor (e.g., a digital signal processor, microprocessor, application specific integrated circuit, a micro-controller, etc.). Of course, the hardware may be alternatively implemented as a finite state machine or even combinatorial logic. An example of "software" includes executable code in the form of an application, an applet, a routine or even a series of instructions. The software may be stored in any type of machine-readable medium.

While the invention has been described in terms of several embodiments, those of ordinary skill in the art will recognize that the invention is not limited to the embodiments described, but can be practiced with modification and alteration within the spirit and scope of the appended claims. The description is thus to be regarded as illustrative instead of limiting. There are numerous other variations to different aspects of the invention described above, which in the interest of conciseness have not been provided in detail. Accordingly, other embodiments are within the scope of the claims.

What is claimed is:

1. A method of dynamically adapting a user volume input range on a mobile device having a global volume range, the method comprising:
   receiving by a user interface a volume input selection from a user, wherein the volume input selection is a level included in the user volume input range, wherein the user volume input range is a portion of the global volume range that is less than an entire global volume range;
   detecting by a processor included in the mobile device an ambient noise level surrounding the mobile device, wherein detecting the ambient noise level includes detecting a change in the ambient noise level; and
   adjusting by the processor the user volume input range from a current portion of the global volume range to a different portion of the global volume range based on the ambient noise level being detected, wherein the volume input selection remains at a same level included in the user volume input range after the user volume input range is adjusted.

2. The method of claim 1, wherein the global volume range includes a range of volumes between a lowest volume level and a loudest volume level, inclusively, that a speaker included in the mobile device can output without distorting audio.

3. The method of claim 1, further comprising:
   when the processor detects an increase in the ambient noise level,
     adjusting by the processor the user volume input range to a portion of the global volume range that includes a higher volumes than the current portion of the global volume range, and
   when the processor detects a decrease in the ambient noise level,
     adjusting by the processor the user volume input range to a portion of the global volume range that includes a lower volumes than the current portion of the global volume range.

4. The method of claim 1, further comprising:
   identifying by the processor a sound profile that corresponds to the ambient noise level being detected; and
   adjusting by the processor the user volume input range from the current portion of the global volume range to a different portion of the global volume range based on the identified sound profile.

5. The method of claim 4, further comprising:
   when the processor identifies the sound profile associated with an increase in the ambient noise level,
     adjusting by the processor the user volume input range to a portion of the global volume range that includes a higher volumes than the current portion of the global volume range, and
   when the processor identifies the sound profile associated with a decrease in the ambient noise level,
     adjusting by the processor the user volume input range to a portion of the global volume range that includes a lower volumes than the current portion of the global volume range.

6. The method of claim 1, wherein the user volume input range is displayed on the user interface as a meter having a plurality of levels, and wherein the volume input selection is one of the plurality of levels.

7. The method of claim 1, further comprising:
   applying by the processor to multiple Digital Signal Processing (DSP) blocks the adjusted user input range.

8. The method of claim 1, wherein the adjusting by the processor the user volume input range is dynamic and gradual, wherein the user volume input range a smoothly moving range across the portions of the global volume range.

9. A non-transitory computer-readable storage medium having instructions stored thereon, which when executed by a processor, causes the processor to perform a method of dynamically adapting a user volume input range on a mobile device having a global volume range, the method comprising:
   receiving a volume input selection from a user, wherein the volume input selection is a level included in the user volume input range, wherein the user volume input range is a portion of the global volume range that is less than an entire global volume range;
   detecting an ambient noise level surrounding the mobile device, wherein detecting the ambient noise level includes detecting a change in the ambient noise level; and
   adjusting the user volume input range from a current portion of the global volume range to a different portion of the global volume range based on the ambient noise level being detected, wherein the volume input selection remains at a same level included in the user volume input range after the user volume input range is adjusted.

10. The non-transitory computer-readable storage medium of claim 9, wherein the global volume range includes a range of volumes between a lowest volume level and a loudest volume level, inclusively, that a speaker included in the mobile device can output without distorting audio.

11. The non-transitory computer-readable storage medium of claim 9, wherein when the instructions are executed by the processor, the instructions further cause the processor to:
   adjust the user volume input range to a portion of the global volume range that includes a higher volumes than the current portion of the global volume range when the processor detects an increase in the ambient noise level, and
   adjust the user volume input range to a portion of the global volume range that includes a lower volumes than the current portion of the global volume range when the processor detects a decrease in the ambient noise level.

12. The non-transitory computer-readable storage medium of claim 9, wherein when the instructions are executed by the processor, the instructions further cause the processor to:
   identify a sound profile that corresponds to the ambient noise level being detected; and
   adjust the user volume input range from the current portion of the global volume range to a different portion of the global volume range based on the identified sound profile.

13. The non-transitory computer-readable storage medium of claim 12, wherein when the instructions are executed by the processor, the instructions further cause the processor to:
   adjust the user volume input range to a portion of the global volume range that includes a higher volumes than the current portion of the global volume range when the processor identifies the sound profile associated with an increase in the ambient noise level, and adjust the user volume input range to a portion of the global volume range that includes a lower volumes than the current portion of the global volume range when the processor identifies the sound profile associated with a decrease in the ambient noise level.

14. A mobile electronic device comprising:
a user interface for receiving a volume input selection from a user, wherein the volume input selection is a level included in a user volume input range, wherein the user volume input range is a portion of a global volume range that is less than an entire global volume range of the mobile electronic device;
a sensor to sense ambient noise surrounding the mobile electronic device;
a processor
to receive the volume input selection from the user interface,
to detect the ambient noise level surrounding the mobile electronic device based on data from the sensor, wherein detecting the ambient noise level includes detecting a change in the ambient noise level, and
to adjust the user volume input range from a current portion of the global volume range to a different portion of the global volume range based on the ambient noise level being detected, wherein the volume input selection remains at the same level included in the user volume input range after the user volume input range is adjusted.

15. The mobile electronic device of claim 14, wherein the global volume range includes a range of volumes between a lowest volume level and a loudest volume level, inclusively, that a speaker included in the mobile electronic device can output without distorting audio.

16. The mobile electronic device of claim 14, wherein
when the processor detects an increase in the ambient noise level,
the processor to adjust the user volume input range to a portion of the global volume range that includes a higher volumes than the current portion of the global volume range, and when the processor detects a decrease in the ambient noise level,
the processor to adjust the user volume input range to a portion of the global volume range that includes a lower volumes than the current portion of the global volume range.

17. The mobile electronic device of claim 14, wherein the processor to:
identify a sound profile that corresponds to the ambient noise level being detected; and
adjust the user volume input range from the current portion of the global volume range to a different portion of the global volume range based on the identified sound profile.

18. The mobile electronic device of claim 17, wherein
when the processor identifies the sound profile associated with an increase in the ambient noise level,
the processor to adjust the user volume input range to a portion of the global volume range that includes a higher volumes than the current portion of the global volume range, and when the processor identifies the sound profile associated with a decrease in the ambient noise level,
the processor to adjust the user volume input range to a portion of the global volume range that includes a lower volumes than the current portion of the global volume range.

19. The mobile electronic device of claim 14, wherein the user interface includes:
buttons and a touch screen to receive the volume input selection from the user, and the touch screen to display the user volume input range as a meter having a plurality of levels,
wherein the volume input selection is one of the plurality of levels.

20. The mobile electronic device of claim 14, wherein the processor to:
apply to multiple Digital Signal Processing (DSP) blocks the adjusted user input range.

* * * * *